United States Patent [19]
Selcuk

[11] Patent Number: 5,981,995
[45] Date of Patent: Nov. 9, 1999

[54] STATIC RANDOM ACCESS MEMORY CELL HAVING BURIED SIDEWALL TRANSISTORS, BURIED BIT LINES, AND BURIED VDD AND VSS NODES

[75] Inventor: Asim A. Selcuk, Cupertino, Calif.

[73] Assignee: Advanced Micro Devices, Inc., Sunnyvale, Calif.

[21] Appl. No.: 08/874,877

[22] Filed: Jun. 13, 1997

[51] Int. Cl.[6] .............................. H01L 27/11; H01L 29/76; H01L 29/94; H01L 31/062
[52] U.S. Cl. .......................... 257/330; 257/393; 257/903
[58] Field of Search .................................. 257/903, 904, 257/393, 330, 331

[56] References Cited

U.S. PATENT DOCUMENTS

| | | | |
|---|---|---|---|
| 4,920,397 | 4/1990 | Ishijima | 257/334 |
| 5,324,973 | 6/1994 | Sivan | 257/330 |
| 5,705,409 | 1/1998 | Witek | 438/212 |
| 5,814,895 | 9/1998 | Hirayama | 257/206 |

Primary Examiner—Brian Dutton
Attorney, Agent, or Firm—Foley & Lardner

[57] ABSTRACT

A static random access memory (SRAM) cell has a decreased cell size and utilizes transistors disposed in a number of trenches. Four trenches generally contain six transistors associated with the memory cell. The transistors are provided as sidewall transistors which are coupled to buried bit lines, VSS nodes, and VDD nodes at the bottom of the trenches. A first trench includes a driver transistor and a load transistor which have gates coupled together by a bridge over the trench. Another bridge is provided over the bridge over the trench to couple the source of the load transistor to the drain of the driver transistor. The drain of the driver transistor is coupled to another drain of the access gate transistor. The access gate transistor is located in a trench with a access gate transistor from another cell. The buried bit line is located in the trench with the access gate transistors.

20 Claims, 5 Drawing Sheets

STATIC RANDOM ACCESS MEMORY CELL HAVING BURIED SIDEWALL TRANSISTORS, BURIED BIT LINES, AND BURIED VDD AND VSS NODES

FIELD OF THE INVENTION

The present invention relates generally to integrated circuit memory devices. More particularly, the present invention relates to a memory cell structure.

BACKGROUND OF THE INVENTION

Semiconductor memory devices such as random access memory (RAM) devices typically include a number of memory cells coupled to at least one bit line. The memory cells often include at least one storage device, one storage node, and one access gate transistor. Generally, two storage transistors which are part of the storage device are coupled between two access gate transistors, and a bit line is coupled to each of the access gate transistors. Thus, each memory cell is often located between two bit lines.

The access gate transistors have gate electrodes which are coupled to word lines. A signal, such as, an address or a select signal, is provided on the word line associated with the memory cell to select or to access a particular memory cell. Once the memory cell is selected via the word line, the memory cell can be read or written to through the access gate transistors via the bit lines.

Semiconductor memory cells include static RAM devices (SRAMs). The memory cell of the SRAM often contains two inverters connected in anti-parallel. Basically, each cell is a flip-flop which has two stable states (e.g., a logic 1 or a logic 0). The memory cell is generally made of four or six transistors. In a four-transistor SRAM cell, a first resistor is coupled in series with a first pull down (e.g., storage or driver) transistor at a first storage node, and a second resistor is coupled in series with a second pull down transistor at a second storage node. A first access gate transistor is coupled between a first bit line and the first storage node, and a second access gate transistor is coupled between a second bit line and a second storage node.

In a six-transistor memory cell, the first and second resistors are replaced by first and second load transistors. The load transistors can be P-channel transistors, diodes, depletion mode N-channel transistors, or other load elements. The pull down transistors and the access gate transistors for both four-transistor cells and six-transistor cells are often N-channel enhancement mode transistors. The load transistors and the load resistors are coupled to a power node (e.g., VCC or VDD), and the driver transistors are coupled to a ground node (e.g., VSS). The power and the ground nodes as well as the bit lines are conventionally provided as metal conductive lines over the semiconductor substrate that are coupled to the memory cell by conductive vias. These metal conductive lines and vias increase the size of the integrated circuit which houses the memory cell.

To advance the storage capacity of memory devices, it has been desirable to house more memory cells on a semiconductor substrate. To house more memory cells, the space taken by the memory cell itself and its associated interconnections must be decreased. For example, in some prior art, six-transistor memory cells included six transistors formed laterally on the top surface of the substrate. This arrangement consumed valuable substrate area. Additionally, valuable space is also consumed by interconnections between the transistors, the bit lines, the power nodes, and the ground nodes.

Thus, there is a need for a memory cell of reduced size. Further, there is a need for a memory cell of minimal size which does not require extensive metal bit lines, power lines, and ground lines. Further still, there is a need for a compact memory cell optimized for internal interconnections.

SUMMARY OF THE INVENTION

The present invention relates to a memory cell, including a first trench formed in a semiconductor substrate and a second trench formed in the semiconductor substrate. The first trench at least partially includes a first load device and a first driver transistor, and the second trench at least partially includes a first access transistor and a first bit line.

The present invention further relates to a static memory cell, including a first sidewall transistor partially formed in a first trench in a semiconductor substrate, a first sidewall driver transistor at least partially formed in the first trench in the semiconductor substrate, a first sidewall access transistor at least partially formed in a second trench in the semiconductor substrate, and a first bit line. The first bit line is coupled to the first access gate transistor within the second trench.

The present invention still further relates to a memory cell, including a load transistor, a driver transistor, a VCC or VDD conductive node, and a VSS conductive node. The load transistor is partially formed in a first trench in a semiconductor substrate, and the driver transistor is at least partially formed in the first trench in the semiconductor substrate. The VDD conductive node is disposed at a bottom of the first trench and coupled to the load transistor, and the VSS node is disposed at the bottom of the first trench and coupled to the driver transistor.

In one aspect of the present invention, the substrate area consumed by the SRAM memory cell is decreased by providing the transistors associated with the memory cell in a number of trenches. The trench structure includes a first trench, which contains a sidewall driver transistor and a sidewall load transistor, and a second trench, which contains a sidewall access transistor and the bit line. The bit line is buried in the second trench, and VDD and VSS nodes are buried in the first trench.

In another aspect of the invention, the sidewall load transistor is located between a storage node and the VDD node, and the sidewall driver or pull down transistor is located between the storage node and ground (e.g., VSS node). The second trench preferably contains two sidewall access gate transistors, one for a first cell and one for a second cell. The bit line is coupled to both access gate transistors and is located between the two sidewall access gate transistors.

In yet another aspect of the present invention, gates of the sidewall transistors are formed by providing a conformal layer in a trench between the drain of the pull down transistor and the source of the load transistor. The drain of the pull down transistor and the source of the access gate transistor are preferably laterally formed on a top surface of the semiconductor substrate. The conformal layer is anisotropically etched to remove it from the bottom of the trench, thereby leaving conductive sidewalls. A strapping layer or local interconnection can be utilized to connect the drain region of the driver transistor to the drain region of the load transistor.

The buried bit lines, VDD node, and VSS nodes are advantageously provided in the semiconductor substrate before the first and second trenches are formed. The first and second trenches are preferably formed to reach the buried bit line, the buried VDD node, and the buried VSS node. The buried VSS node is a N-plus region at the bottom of the first trench, and the buried bit line is a N-plus region at the bottom of the second trench. The N-plus region of the first trench is the source of the driver transistor. The N-plus region of the second trench is the source of the access gate transistor. The buried VDD node is a P-plus region at the bottom of the first trench. The P-plus region is the source of the load transistor.

The first and second trenches preferably make up more than half of a six-transistor SRAM cell and have storage nodes cross-coupled with a local interconnection to the other half of the SRAM cell. The trenches include buried bit lines and nodes for the memory cell.

BRIEF DESCRIPTION OF THE DRAWINGS

The invention will hereafter be described with reference to the accompanying drawings, wherein like numerals denote like elements, and.

DETAILED DESCRIPTION OF THE PREFERRED EXEMPLARY EMBODIMENT OF THE PRESENT INVENTION

Figure 1:
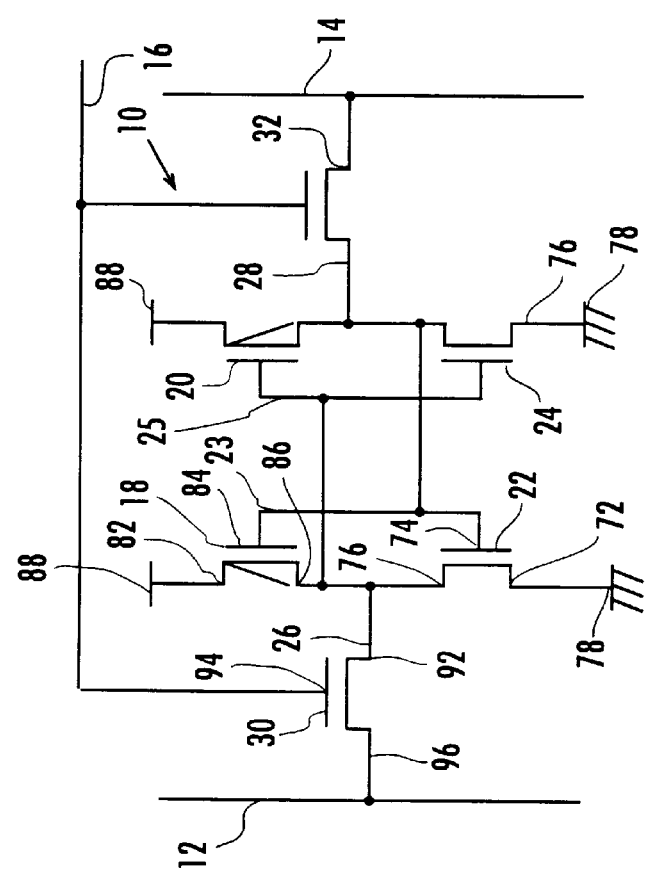
FIG. 1 is an electrical schematic drawing of a memory cell in accordance with an exemplary embodiment of the present invention.

With reference to FIG. 1, a memory cell 10 is coupled between complementary bit lines 12 and 14 and is coupled to a word line 16. Memory cell 10 is preferably a static random access memory cell (SRAM) including a load transistor 18, a load transistor 20, a driver or pull down transistor 22, and a pull down transistor 24. Transistors 18, 20, 22, and 24 are coupled together to form cross-coupled inverters having a storage node 26 and a storage node 28.

Transistors 18 and 20 are preferably P-channel transistors, but may be replaced by polysilicon or other resistors, N-channel depletion mode transistors, or other electrical devices for raising the voltage at storage nodes 26 and 28 when pull down transistors 22 and 24 are turned OFF, respectively. Pull down transistors 22 and 24 are preferably N-channel transistors, although other types of transistors, such as, bipolar transistors or other devices, may be utilized. Transistors 22 and 24 are preferably conventional N-channel enhancement mode transistors having a gate threshold voltage between 0.5 and 0.6 volts (V).

Storage node 26 is coupled to a access gate transistor 30 which is controlled by word line 16. Storage node 28 is coupled to an access gate transistor 32 which is also controlled by word line 16. Access gate transistors 30 and 32 are preferably N-channel enhancement mode transistors having a gate threshold voltage between 0.5 and 0.6V, although other types of transistors may be utilized.

Transistor 22 includes a source 72, a gate 74, and a drain 76. Drain 76 is coupled to node 26, and source 72 is coupled to a VSS node 78. Gate 74 is coupled to node 28. Transistor 18 includes a source 82, a gate 84, and a drain 86. Source 82 is coupled to a VDD node 88, and drain 86 is coupled to node 26. Gate 84 is coupled to node 28. Node 78 is preferably coupled to ground or to a substrate bias signal, and node 88 is preferably coupled to VDD, which can be 3.3V.

Transistor 30 includes a drain 92, a gate 94, and a source 96. Source 96 is coupled to bit line 12, and gate 94 is coupled to word line 16. Drain 92 is coupled to node 26. Transistors 20, 24, and 32 include drain sources and gates coupled similarly to transistors 18, 22, and 30, respectively, as discussed above. Alternatively, drain 92 and source 96 can be interchanged. Also, the terms drain and source as used in this patent application can refer to either terminal of the transistor.

In operation, cell 10 stores logic signals, data, or information, such as, a logic 1 (e.g., VDD, VCC, 5V, or 3.3V) or a logic 0 (e.g., VSS or ground) on nodes 26 and 28. When transistor 22 is turned on, transistor 18 is turned off, and node 26 is coupled to VSS node 78 (ground). When transistor 24 is turned off, transistor 20 is turned on, and node 28 is coupled to VDD node 88 (power or VDD). Conversely, when transistor 22 is turned off, transistor 18 is turned on, and node 26 is coupled to VDD node 88. When transistor 24 is turned on, transistor 20 is turned off, and node 28 is coupled to VSS node 78. The logic level stored on node 26 is opposite the logic level stored on node 28.

Cell 10 is accessed for reading from and writing to nodes 26 and 28 when a select signal, such as, a logic 1, VDD, or VCC, is provided on word line 16. Memory cell 10 is accessed as access gate transistors 30 and 32 couple bit lines 12 and 14 to nodes 26 and 28, respectively, in response to the select signal on word line 16.

In a read operation, cell 10 is accessed by providing the select signal on line 16. During the read operation, the signal at storage node 26 is provided to bit line 12, while the signal at storage node 28 is provided to bit line 14. The signals on lines 12 and 14 are then read by a sense amplifier (not shown).

In a write operation, cell 10 is accessed by providing the select signal on line 16. During the write operation, the signal on bit line 12 is driven to node 26, while the signal on bit line 14 is driven to node 28. After the select signal on line 16 is removed, cell 10 stores the signals driven on lines 12 and 14. Cell 10 stores the signals on nodes 26 and 28, respectively.

Figure 2:
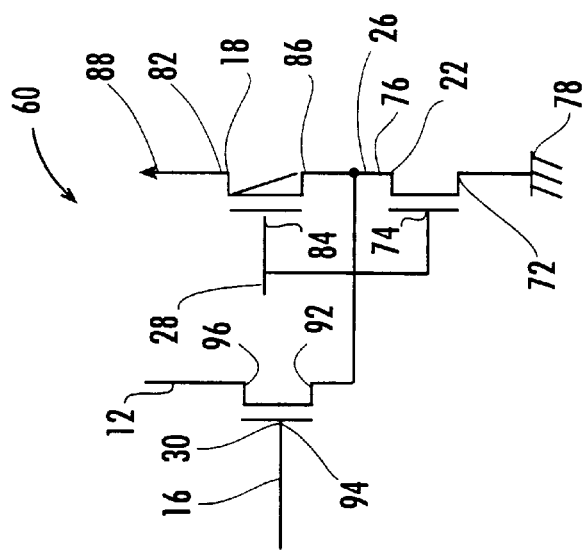
FIG. 2 is a more detailed electrical schematic drawing of a portion of the memory cell illustrated in FIG. 1 in accordance with an exemplary embodiment of the present invention.

With reference to FIG. 2, a portion 60 of cell 10 is shown for simplicity when comparing cell 10 to semiconductor substrate 70 illustrated in FIGS. 3–6. Transistors 18, 20, 22, 24, 30, and 32 are preferably vertical transistors. A portion (not shown) of cell 10, including transistors 20, 24, and 32, can be constructed similar to portion 60 as described below with respect to FIGS. 3–5 and is interconnected with portion 60 to form cell 10.

Figure 3:
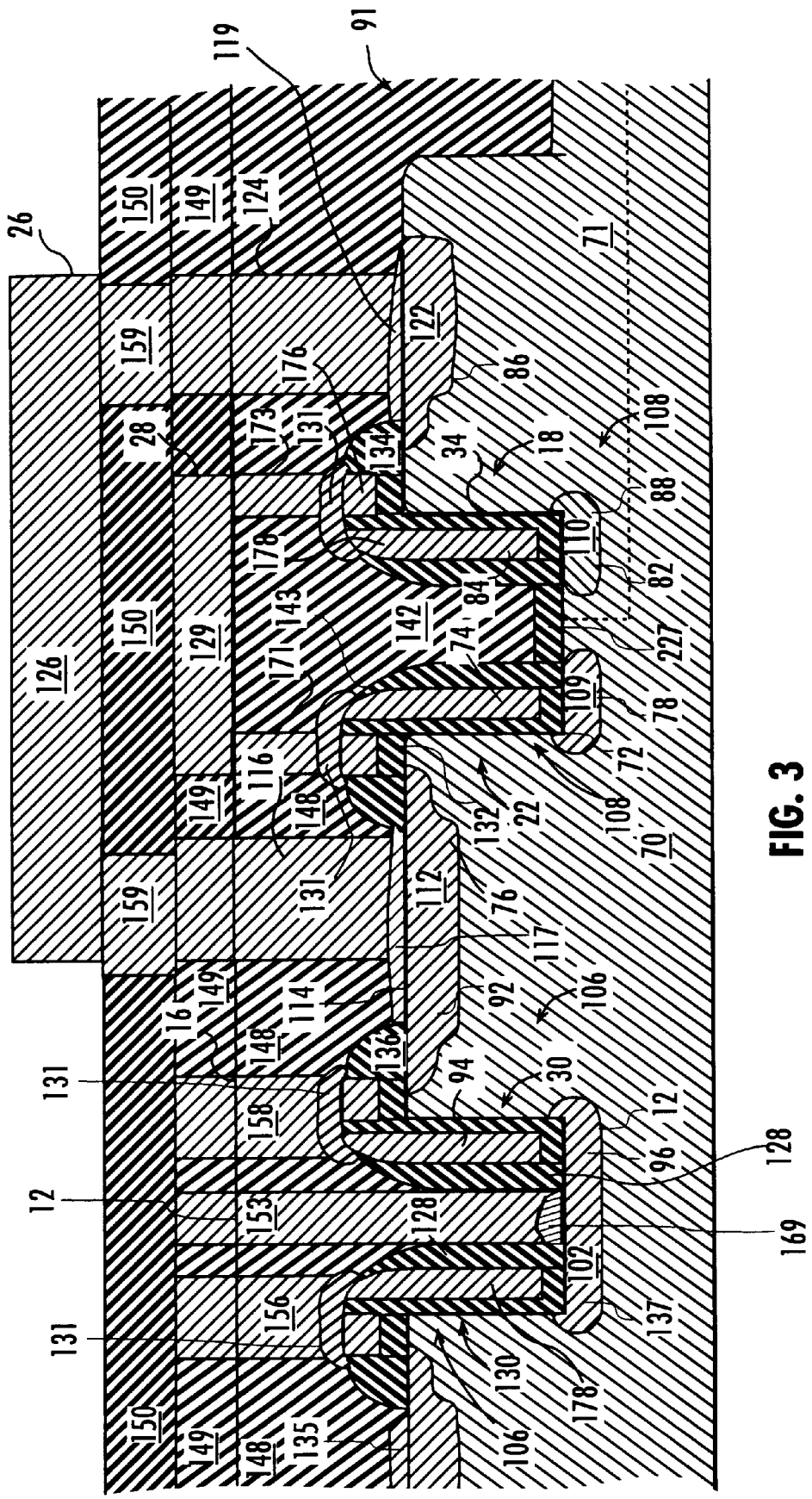
FIG. 3 is a cross-sectional view of a semiconductor substrate, including the portion of the memory cell schematically illustrated in FIG. 2.

With reference to FIG. 3, a cross-sectional view of portion 60 includes transistors 18, 22, and 30, which are vertical or sidewall transistors formed in a P-type semiconductor substrate 70. Portion 60 is provided in a trench 106 and a trench 108. Trench 106 includes bit line 12, and transistor 30.

Trench 108 includes VSS node 78, VDD node 88, transistor 18, and transistor 22.

Source 72 and VSS node 78 are part of a buried N-plus region 109. Source 82 and VDD node 88 are part of a buried P-plus region 110 in a N-well 71 which is provided in substrate 70. Portion 60 is isolated from other devices (not shown) by an isolation trench 91.

Drain 92 and drain 76 are part of a N-plus region 112 formed in a top surface 114 of substrate 70. Region 112 is coupled to a conductive contact via 116 through a polycide layer 117. Drain 86 is part of a P-plus region 122 formed on top surface 114 of substrate 70 over well 71. Region 122 is coupled to a conductive contact via 124 through a polycide layer 119. Vias 116 and 124 are preferably made of several layers and contacts and can be tungsten, aluminum, metal, or other conductive material.

Conductive vias 116 and 124 are coupled together at storage node 26 via a conductive bridge, interconnection, or layer 126. Gates 74 and 84 are coupled together by vias 171 and 173, and a conductive material 129, which is coupled to storage node 28.

Gates 74, 84, and 94 are provided over a gate oxide region 132, 134, and 136, respectively. Gates 74, 84 and 94 are each comprised of a top conductor 176 and a side wall conductor 178 (see gate 84 in FIG. 3) as is discussed in greater detail with reference to FIGS. 4 and 6. A polycide layer 131 couples conductor 176 to conductor 178 for each of gates 74, 84, and 94. Vias 171 and 173 are coupled to gates 74 and 84, respectively, at layer 131.

Bit line 12, node 78, and node 88 can be interconnected by vias (not shown) or otherwise connected to metal layers (not shown). Connections can be at various places on substrate 70 and preferably do not interfere with the placement of portion 60.

Trench 108 is partially filled with an insulative material 142 to isolate gates 74 and 84. Similarly, insulative layer 128 is provided between bit line 12 and a gate of transistor 130 and between bit line 12 and gate 94 to isolate bit line 12 from the devices within trench 106. A conductive via 153 is coupled to a polycide layer 169 which is coupled to region 102. Via 153 allows region 102 to be eventually connected to a metal layer. Vias 153, 156, and 158 are preferably comprised of several layers or contacts similar to vias 116 and 124.

An insulating layer 148 is provided above surface 114 of substrate 70. An insulating layer 149 is provided over layer 148. An insulating layer 150 is provided over layer 149 and conductive material 129 (between nodes 26 and 28). Insulating layers 128, 148, 149 and 150 and materials 142 and 143 can be spin-on-glass (SOG), silicon dioxide, TEOS oxide, TECVD TEOS oxide, SiH$_4$-based PECVD oxide, or other insulative material. Regions 132, 134, and 136 are preferably liner oxides grown on the sidewalls of trenches 106 and 108 and between conductor 176 and surface 114 and are discussed in greater detail with reference to FIGS. 5 and 6.

Drain 96 of transistor 30 is provided as part of a buried N-plus doped region 102 in substrate 70. Additionally, an access gate transistor 130 for another memory cell (not shown) similar to memory cell 10 includes a gate, a drain 135, and a source 137. Source 137 and source 96 are part of region 102, which is part of bit line 12.

The structure of portion 60 provides several geometric features which advantageously reduce the size of the cell. For example, trench 106 can include access transistors 30 and 130 for two different cells 10. Access transistors 30 and 130 can advantageously share bit line 12 which is a buried N-plus region 102. Similarly, the connection between drain 92 and drain 76 is advantageously made by N-plus region 112. Trench 108 includes transistors 18 and 22, power or voltage supply (VDD) node 88, and ground (VSS) node 78 for cell 10. Thus, portion 60 can be provided in a compact structure on substrate 70.

Figure 4:
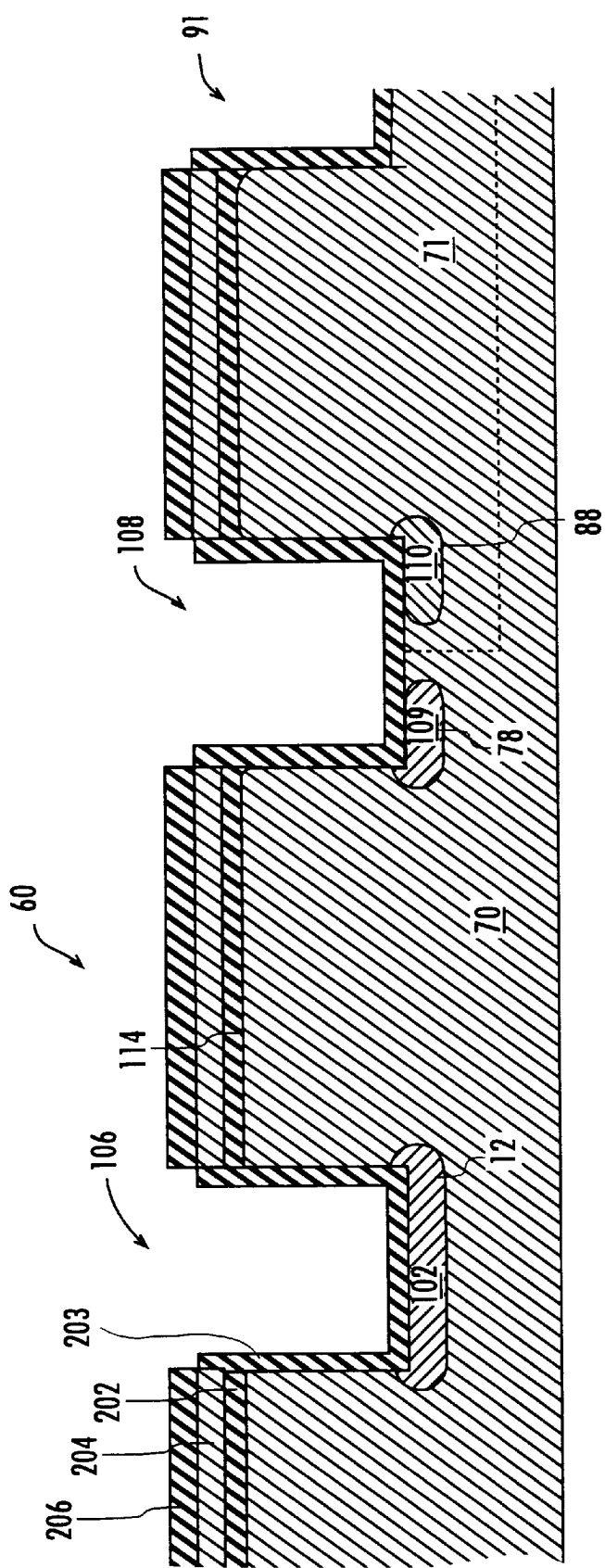
FIG. 4 is a cross-sectional view of the semiconductor substrate illustrated in FIG. 3, including two trenches, buried nodes, and a buried bit line.

With reference to FIGS. 3, 4, 5 and 6, the method of manufacturing portion 60 of cell 10 is described as follows. In FIG. 4, substrate 70 is masked and implanted with N-type dopants to create well 71. An oxide layer 202 is thermally grown on surface 114 of substrate 70 for eventual formation of portions of gate oxide regions 132, 134 and 136 (FIG. 3). A conductive layer such as a polysilicon layer 204 is deposited over layer 202 and an etch-stop layer such as a nitride layer 206 is deposited over layer 204.

Substrate 70 is masked so that trenches 106 and 108 can be etched. Trenches 106 and 108 are etched by reactive ion etching (RIE), directional dry etching or other trench-forming techniques. Trenches 106 and 108 are preferably 0.35 to 1.0 microns deep and 0.35 to 1.0 microns wide (depending upon the fabrication technique) for 0.25 micron technology. The etching of trenches 106 and 108 preferably is a combination etch to remove layers 206, 204, 202 and substrate 70.

After trenches 106 and 108 are etched in substrate 70, substrate 70 is masked to form regions 102, 109 and 110 at the bottom of trenches 106 and 108. Regions 102 and 109 are implanted with N-type dopants, and region 110 is implanted with P-type dopants.

Figure 5:
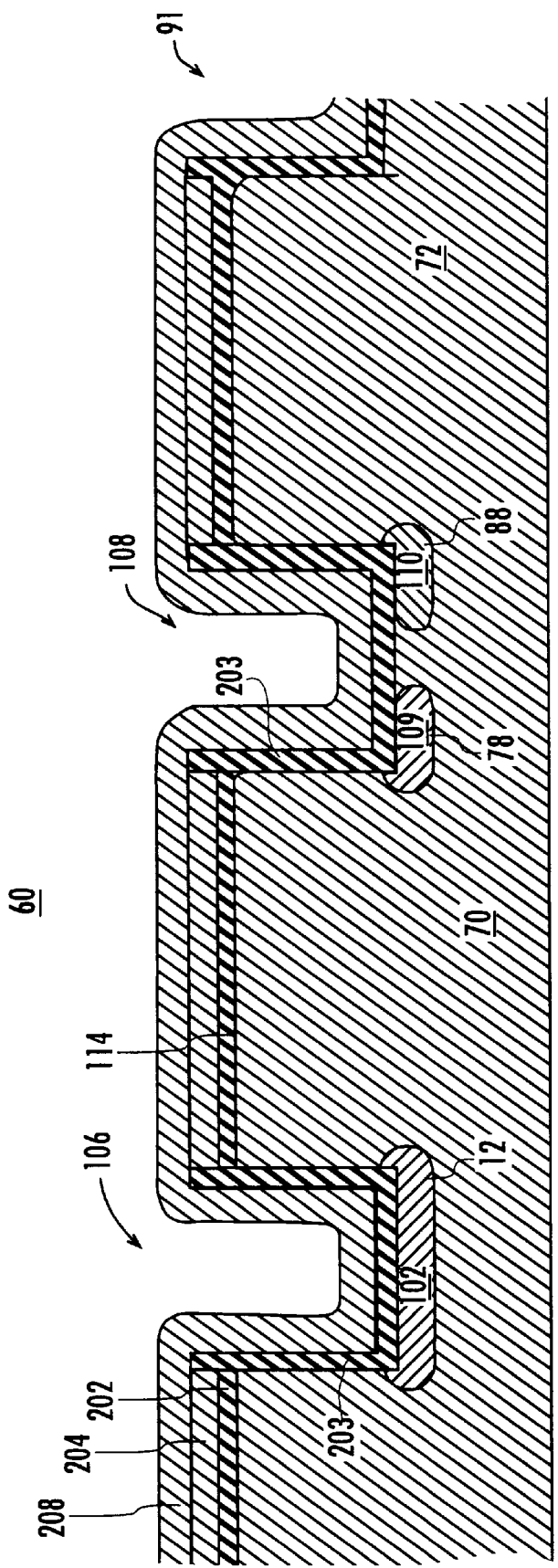
FIG. 5 is a cross-sectional view of the semiconductor substrate illustrated in FIG. 4, including a conformal layer disposed in the two trenches.

After implantation of regions 102, 109 and 110, a gate oxide layer 203 is thermally grown on the sidewalls of trenches 106 and 108. Thus, layers 202 and 203 cooperate to form gate oxide regions 134 for gates 74, 84 and 94. After layer 203 is formed on sidewalls and bottoms of trenches 106 and 108, layer 206 is removed by selective etching. In FIG. 5, a conformal layer 208 of polysilicon is deposited on top of layer 204 and within trenches 91, 106 and 108. Preferably, layer 208 is provided over layer 203 on the sidewalls of trenches 106 and 108. Conformal layer 208 preferably forms the sidewall conductor 178 (see gate 74 in FIG. 3) for gates 74, 84 and 94.

Figure 6:
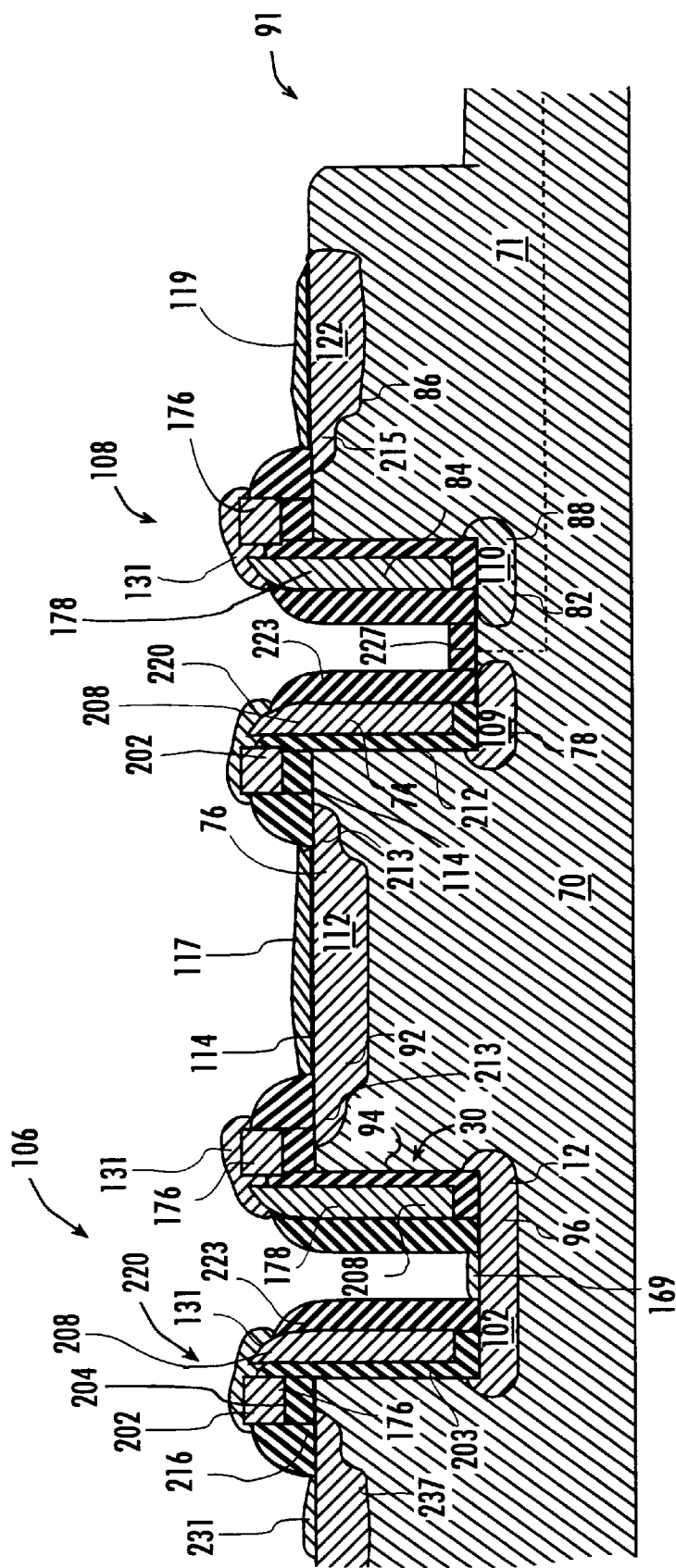
FIG. 6 is a cross-sectional view of the semiconductor substrate illustrated in FIG. 5 wherein the conformal layer is partially etched to leave gates within the trenches.

In FIG. 6, substrate 70 is masked and etched to remove layer 208 from the bottom of trenches 106 and 108 and from above top surface 114 of substrate 70 and the sidewall and bottom of trench 91. Substrate 70 is also etched to remove most of layer 202 and 204 from top surface 114 of substrate 70. Therefore, substrate 70 preferably only includes portions of layers 202, 203, 204 and 208 necessary for the structure of gates 74, 84 and 94.

Substrate 70 is also masked to implant portions 213 of region 112, and a portion 215 of region 122. Portion 213 is implanted to form a N doped connector region and a portion 215 is implanted to form a P doped connector region (e.g., lightly doped). Next, a conformal oxide layer (not shown) is deposited and etched to leave sidewall spacers 223 and spacers 216 for gates 74, 84 and 94. After forming spacers 216 and 223, region 237 and region 112 are implanted with N-type dopants.

Substrate 70 is masked to provide an oxide layer 227 on the bottom of trench 108. Next, a silicide layer 131 is selectively formed to couple conductor 176 to conductor 178 for gates 74, 84 and 94. Additionally, a silicide layer 117 and a silicide layer 119 is provided on regions 112 and 122, respectively, to provide connections to various structures on substrate 70. Also, silicide layers 169 and 231 are provided for connections to regions 102 and 237, respectively. Layers 117, 119, 168, 220, and 231 can be replaced by other conductive material such as polysilicon or other conductive material.

With reference to FIG. 3, insulating layer 148 is provided over top surface 114 of substrate 70. Layer 148 is planarized and selectively etched to form holes for conductive vias 171 and 173. Additionally, holes for conductive vias 156, 158, 116 and 124 are formed at this stage. After the holes for vias 171 and 173 are formed, conductive material 129 is provided within the holes discussed above to form vias 156, 158, 116 and 124 and over insulative layer 148 to form node 28.

After material 129 is provided, insulative layer 149 is provided over layer 148. Layer 149 is planarized and selectively etched similar to layer 148 to form holes for vias 116, 124, 153, 156 and 158. The holes are filled to form vias 156, 158, 116 and 124 as discussed above. Layer 150 is planarized and etched to form holes for vias 159. After layer 149 is provided, layer 150 is provided over layer 149 and layer 129. After layer 150 is provided, conductive layer 126 is provided to form node 26 and vias 159. An insulative layer (not shown) can be provided over layer 126 and other metal layer or conductive layers (not shown) for interconnections can be provided over the insulative layer. The metal layer can serve to contact regions 102, 109 and 110 as well as nodes 26 and 28 on substrate 70.

Alternatively, insulating layer 149 can be eliminated and insulating layer 150 provided directly over layer 148 and a metal layer 157 which is coupled to conductive vias 153, 156, and 158. In such an alternative, layer 148 is planarized and holes for vias 116, 124, 153, 156, 158, 171, and 173 are masked and etched. The holes are filled with a conductive material for contacts and planarized. After planarization, metal layer 157 is deposited on top of conductive vias 116, 124, 153, 156, 158, 171, and 173. Layer 129 can be provided as part of layer 157. Layer 157 is masked and etched to define strap layer, word line, and bit line connections, such as connections to vias 116, 124, 153, 156, 158, 171 and 173. Next, layer 150 is deposited as an intermetal oxide.

Layer 150 is masked and etched to form holes for contacts 159 associated with conductive vias 116 and 124. Layer 126 as a second metal layer is deposited on top of layer 150. Layer 126 is masked and etched, and an insulating layer (not shown) is deposited over layer 126. After the insulating layer is deposited over layer 126, portion 60 is subjected to semiconductor processes to form contacts, connections, and other structures necessary for the structure of the integrated circuit.

It will be understood that the foregoing description is of preferred exemplary embodiments of the invention, and that the invention is not limited to the specific forms shown. For example, the types of dopants in the various regions and wells could be changed. Further, although N-channel enhancement mode driver transistors and P-channel load transistors are shown, other types of transistors can be located in the trenches. Further, the particular groupings of transistors in the particular trenches can be modified. Any modifications which may be apparent from reading the foregoing description which do not depart from the scope of the invention as expressed in the appended claims are intended to be covered.

What is claimed is:

1. A memory cell comprising:
   a first trench formed in a semiconductor substrate, the first trench at least partially including a first load device and a first driver transistor; and
   a second trench formed in the semiconductor substrate, the second trench at least partially including a first access transistor and a first bit line.

2. The memory cell of claim 1 further comprising:
   a third trench formed in a semiconductor substrate, the third trench at least partially including a second load device and a second driver transistor; and
   a fourth trench formed in the semiconductor substrate, the fourth trench at least partially including a second access transistor and a second bit line.

3. The memory cell of claim 2 wherein the first load device and the second load device are PMOS transistors.

4. The memory cell of claim 1 wherein the first trench includes a first wall and a second wall, and wherein the first load device is a load transistor, the load transistor having a gate disposed over the first wall, and the first driver transistor having a gate disposed over the second wall.

5. The memory cell of claim 4 wherein the gate of the load transistor and the gate of the driver transistor are coupled by a conductive material over a top opening of the first trench.

6. The memory cell of claim 5 wherein a drain of the driver transistor is coupled to a drain of the load transistor by an interconnection disposed over the conductive material.

7. The memory cell of claim 4 wherein the second trench includes a first wall, and a gate of the first access transistor is disposed over the first wall of the second trench.

8. The memory cell of claim 7 wherein a top surface of the substrate has a doped region between the first and second trench, and the doped region forms a drain of the first access transistor and a drain of the first driver transistor.

9. The memory cell of claim 1 wherein a bottom of the first trench includes a first doped region and a second doped region, the first doped region being a source of the first driver transistor and coupled to VSS, and the second doped region being the source of first load device coupled to VDD.

10. The memory cell of claim 9 wherein a bottom of the second trench includes a third doped region, the third doped region being the source of the first access transistor and being coupled to the first bit line.

11. A static memory cell, comprising:
    a first side wall load transistor partially formed in a first trench in a semiconductor substrate;
    a first side wall driver transistor at least partially formed in the first trench in the semiconductor substrate;
    a first sidewall access gate transistor at least partially formed in a second trench in the semiconductor substrate; and
    a first bit line coupled to the first access gate transistor within the second trench.

12. The static memory cell of claim 11, further comprising:
    a second side wall load transistor at least partially formed in a third trench in the semiconductor substrate;
    a second side wall driver transistor at least partially formed in the third trench in the semiconductor substrate; and
    a second sidewall access gate transistor at least partially formed in a fourth trench in the semiconductor substrate; and
    a second bit line coupled to the second access gate transistor within the fourth trench.

13. The memory cell of claim 12 wherein the first bit line is disposed at a bottom of the second trench, and the second bit line is disposed at the bottom of the fourth trench.

14. The memory cell of claim 13 wherein a VSS line is disposed at a bottom of the first trench and at a bottom of the third trench.

15. The memory cell of claim 14 wherein a VDD line is disposed at the bottom of the first trench and at the bottom of the third trench.

16. A memory cell, comprising:
- a load transistor partially formed in a first trench in a semiconductor substrate;
- a driver transistor at least partially formed in the first trench in the semiconductor substrate;
- a VDD conductive node disposed at a bottom of the first trench and coupled to the load transistor; and
- a VSS conductive node disposed at the bottom of the first trench and coupled to the driver transistor.

17. The memory cell of claim 16 further comprising:
- a access gate transistor at least partially formed in a second trench in the semiconductor substrate; and
- a bit line coupled to the first access gate transistor within the second trench.

18. The memory cell of claim 16 wherein a top surface of the substrate has a doped region between the first trench and the second trench, and the doped region forms a drain of the access transistor and a drain of the driver transistor.

19. The memory cell of claim 18 wherein a gate of the load transistor and a gate of the driver transistor are coupled by a conductive material over a top opening of the first trench.

20. The memory cell of claim 19 wherein a drain of the driver transistor is coupled to a drain of the load transistor by an interconnection disposed over the conductive material.

* * * * *